United States Patent [19]

Dishal

[11] 4,237,555

[45] Dec. 2, 1980

[54] AUTOMATIC MODULATION SYSTEM

[75] Inventor: Milton Dishal, Clifton, N.J.

[73] Assignee: International Telephone and Telegraph Corporation, New York, N.Y.

[21] Appl. No.: 75,626

[22] Filed: Sep. 14, 1979

[51] Int. Cl.[3] .......................... H04B 1/02; H03C 1/06

[52] U.S. Cl. ................................ 455/108; 332/37 D; 455/116; 455/126

[58] Field of Search ............... 455/108, 116, 126, 129; 332/37 R, 37 D, 38

[56] References Cited

U.S. PATENT DOCUMENTS

| | | | |
|---|---|---|---|
| 3,200,336 | 8/1965 | Valakos et al. | 455/116 |
| 3,662,290 | 5/1972 | Elliott | 455/237 |
| 3,668,533 | 6/1972 | Fish et al. | 455/237 |
| 4,044,308 | 8/1977 | Stites et al. | 455/116 |

*Primary Examiner*—Marc E. Bookbinder
*Attorney, Agent, or Firm*—John T. O'Halloran; Alfred C. Hill

[57] ABSTRACT

The feedback controlled modulation system comprises an extended range, gain controlled detector system disposed in a first feedback loop coupled between the output and input of an amplifier having a non-linear input-output characteristic; a gain controlled reference signal source coupled to the output of the detector system to provide a difference signal in the first feedback loop; and a gain controlling pulse generator coupled to the source and the detector system to simultaneously control the gain of the source and the gain of the detector system to control the shape of the difference signal so as to linearize the non-linear characteristic without loss of loop stability and without causing amplitude distortion in the first feedback loop. In addition, the modulation system includes an exciter which provides controllable amplitude, rectangular pulses; an amplitude modulator disposed in the first feedback loop coupled to the input of the amplifier and output of the exciter responsive to the rectangular pulses and an amplified version of the shaped difference signal; a second feedback loop coupled between the output and input of the exciter to provide an extremely flat top for each of the rectangular pulses; and a third feedback loop coupled to the first and second feedback loops responsive to a predetermined gated portion of the amplified version of the difference signal to produce a control signal for the second feedback loop to accurately control the amplitude of the flat top rectangular pulses so as to hold the amplitude of a baseline portion of the output signal of the modulator exactly at the threshold of the linearized characteristic.

64 Claims, 15 Drawing Figures

AUTOMATIC MODULATION SYSTEM

BACKGROUND OF THE INVENTION

The present invention relates to modulation systems and more particularly to a feedback controlled modulation system for an amplifier having an input-output characteristic including a linear portion and at least a lower non-linear portion, and which uses an envelope detector to produce the feedback signal, as exemplified in FIG. 1.

The following description will be concerned with a Class C power amplifier. However, it is to be understood that the feedback system of the present invention is applicable to any type of amplifier having a non-linear input-output characteristic.

As is well understood, Nyquist's criterion must always be satisfied to guarantee feedback loop stability; and it may be helpful to note that this basic requirement can often be straightforwardly satisfied by having just a single narrow band stage in the feedback loop, with all other stages in the loop supplying a bandwidth greater than a certain critical value.

An important practical accomplishment of the present invention is that it allows the improvement to be described hereinbelow to be practically accomplished without reducing the above described required excess loop bandwidth of the system, thus allowing Nyquist's criterion to continue to be satisfied.

As illustrated in FIG. 3 of the drawing, the Class C power amplifier and the envelope detector, as employed in a Vortac transmitter have an input-output characteristic which includes an upper non-linear portion 1, a linear portion 2 and a lower non-linear portion 3. As illustrated in FIG. 3, there is appreciable incremental gain in the linear portion 2 with only very small varying incremental gain in the non-linear portions 1 and 3.

When employing solid state power devices for the Class C power amplifier the output waveform is also a bad function of "time on" so that the gain is also a function of the time width of the signal driving the amplifier.

The non-linear input-output characteristic illustrated in FIG. 3 is inherent in Class C amplifiers and in envelope detectors. Because of this non-linear input-output characteristic, prior art feedback systems, such as illustrated in FIG. 1, which will supply enough loop gain to produce desired system results in the linear portion 2 of the characteristic illustrated in FIG. 3, lose their loop gain in portions 1 and 3 of FIG. 3 and, therefore, unsatisfactory system performance results in these non-linear portions.

A simple procedure for attempting to overcome the above described limitations in portions 1 and 3 of FIG. 3 is to add a compensating shaped gain circuit in the feedback loop as illustrated in FIG. 2 to produce a gain characteristic which is a function of the amplitude of the modulating signal so that the effective input-output characteristic of the difference amplifier-power amplifier combination is linear throughout a desired dynamic range (i.e. with a Class C non-linear characteristic as part of a system, an overall compensated linear characteristic can never be obtained over an infinite dynamic range).

The above described simple procedure will not succeed for two practical reasons:

1. The added stages required to supply the large amount of additional shaped gain required usually unacceptably reduce the required excess loop bandwidth required for stable feedback performance.
2. Most importantly from a practical point of view, the usual envelope detector cannot linearly detect the low outputs involved in portion 3 of FIG. 3, and in this region it, therefore, does not at all supply the correct feedback signal to the difference circuit.

In addition to the foregoing disadvantages of the systems of FIGS. 1 and 2, neither of these systems solve the problem of automatically ensuring that the input signal to the power amplifier has the exactly correct amplitude to cause the system to reach the threshold of its linearized Class C characteristic.

One of the major engineering problems encountered in attempting to meet operating specifications for a Class C transmitter, such as a Vortac transmitter, is to meet the spectrum specifications which requires providing a given spectrum to −50 to −60 db (decibels) down from the peak of spectrum. Neither of the systems of FIGS. 1 and 2 are capable of meeting this spectrum specification.

The system of the present invention illustrated in FIG. 5 overcomes all of the above-mentioned disadvantages by operating as follows:

1. First, the gain of the reference amplifier which drives the difference circuit is shaped as a function of the modulating signal level in such a way that, with feedback removed, the resulting reference amplifier-power amplifier combination is approximately linear throughout the desired dynamic range of the system as illustrated in FIG. 4. Because the reference amplifier of FIG. 5 is not in the feedback loop, adding stages to this amplifier to supply the large amount of amplitude controlled increased gain required to compensate for the non-linear region 3 of FIG. 3 does not affect the loop gain excess bandwidth and, therefore, feedback stability is not destroyed by this procedure.
2. Next, and most importantly, the linear range of the usual envelope detector is extended so that it covers the desired dynamic range of the system. This is accomplished by an arrangement fully disclosed in my co-pending application Ser. No. 075,613, filed Sept. 14, 1979. Here also it is important to note that when the disclosure of the above-cited co-pending application is used, the linear dynamic range of an envelope detecting system can be successfully extended in a practical way while still supplying enough excess bandwidth to satisfy the necessary feedback loop stability criteria.
3. The gain of the extended range envelope detector system is then shaped so that it changes as a function of the modulating signal level in approximately the same manner that the reference amplifier gain is changed as described in 1 above. An important practical advantage of this extended range envelope detector is the fact that this gain shaping can be accomplished after detection; i.e. it does not have to be done in the auxiliary wide band limiting RF amplifier which is used in the extended range envelope detector system, and that it can be practically accomplished with sufficient excess bandwidth to preserve loop stability.
4. Two control loops are provided for the exciter to ensure that the output signal of the exciter has an extremely flat top and the exactly correct amplitude to cause the power amplifier to operate in the extended linear range of its Class C characteristic.

5. Taking all of the above together, the system of the present invention is capable of meeting or exceeding the above-indicated stringent spectrum specification.

When the above procedures are accomplished, it is possible to successfully provide a real time feedback controlled modulation system which overcomes the above-mentioned disadvantages of the prior arrangements caused by the low gain, non-linear, transfer characteristic portions 1 and 3 of FIG. 3 of Class C amplifiers and envelope detectors which are basic parts of many transmission systems.

SUMMARY OF THE INVENTION

It is an object of the present invention to provide a real time feedback controlled modulation system overcoming the disadvantages of the above-mentioned real time feedback systems.

Another object of the present invention is to provide a feedback controlled modulation system for a Class C power amplifier in which both the modulating waveform and fed-back signal are shaped to compensate for the non-linear Class C power amplifier input-output characteristic and the non-linear diode detector characteristic.

A further object of the present invention is to provide a feedback controlled modulation system wherein the gain of a reference amplifier and the gain of the fed-back-signal unit are simultaneously adjusted in step in a way which allows the requirements for feedback loop stability to be satisfied and introduces no amplitude distortion.

A feature of the present invention is the provision of a multistate feedback controlled modulation system for linearizing and stabilizing an amplifier having an input-output characteristic including a linear portion and at least a lower non-linear portion comprising: an extended range, gain controlled detector system disposed in a first feedback loop coupled between the output and input of the amplifier; a gain controlled reference signal source coupled to the output of the detector system to provide a difference signal in the first feedback loop; a gain controlling pulse generator coupled to the source and the detector system to simultaneously control the gain of the source and the gain of the detector system to control the shape of the difference signal so as to linearize the lower non-linear portion of the characteristic without loss of loop stability and without causing amplitude distortion in the first feedback loop; an exciter to provide controllable amplitude, rectangular pulses; a first amplitude modulator disposed in the first feedback loop coupled to the input of the amplifier and the output of the exciter responsive to an amplified version of the difference signal and the rectangular pulses; a second feedback loop coupled between the output and the input of the exciter to provide an extremely flat top for each of the rectangular pulses; and a third feedback loop coupled to the first and second feedback loops responsive to a predetermined gated portion of the amplified version of the difference signal to produce a control signal for the second feedback loop to accurately control the amplitude of the flat top rectangular pulses so as to hold the amplitude of a baseline portion of the output signal of the modulator exactly at the threshold of the linearized characteristic.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

Figure 1:
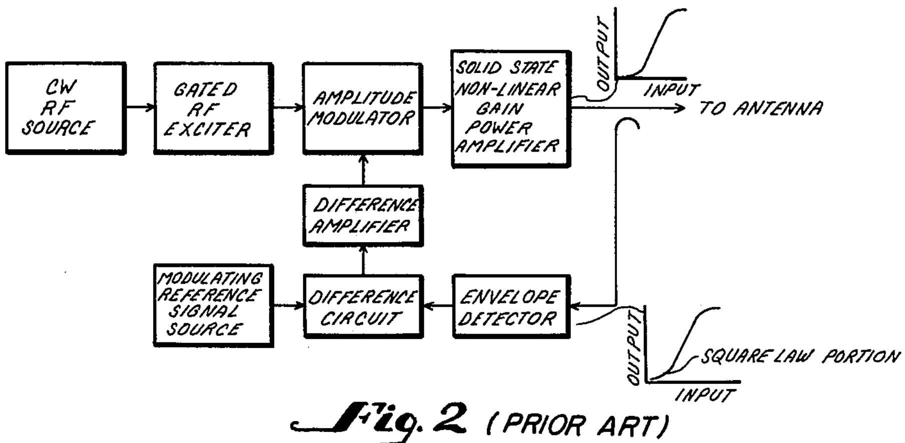
FIG. 1 is a block diagram of a prior art feedback controlled modulation system.
Figure 2:
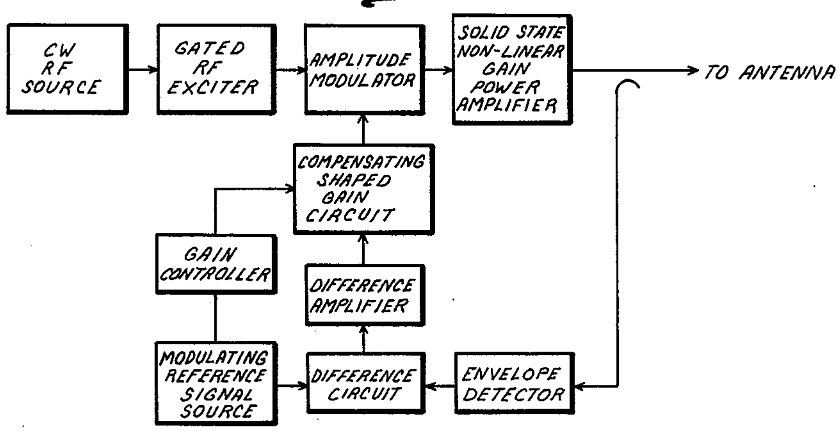
FIG. 2 is a block diagram of a prior art feedback controlled modulation system which in concept can compensate for the non-linearities of the system of FIG. 1.
Figure 3:
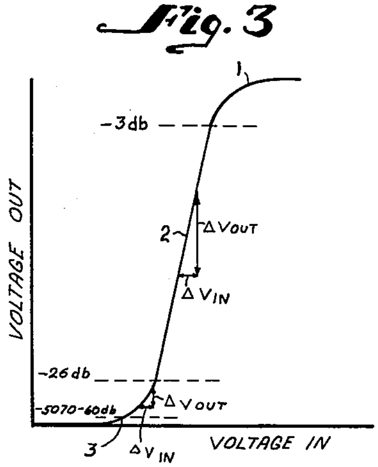
FIG. 3 illustrates the input-output characteristic of the power amplifier involved and also that of the diode envelope detectors.
Figure 4:
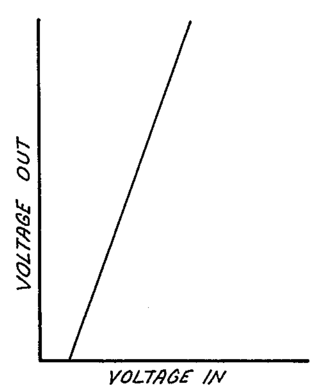
FIG. 4 is a desired linear input-output modulation characteristic achieved by the feedback controlled modulation system of the present invention.
Figure 5:
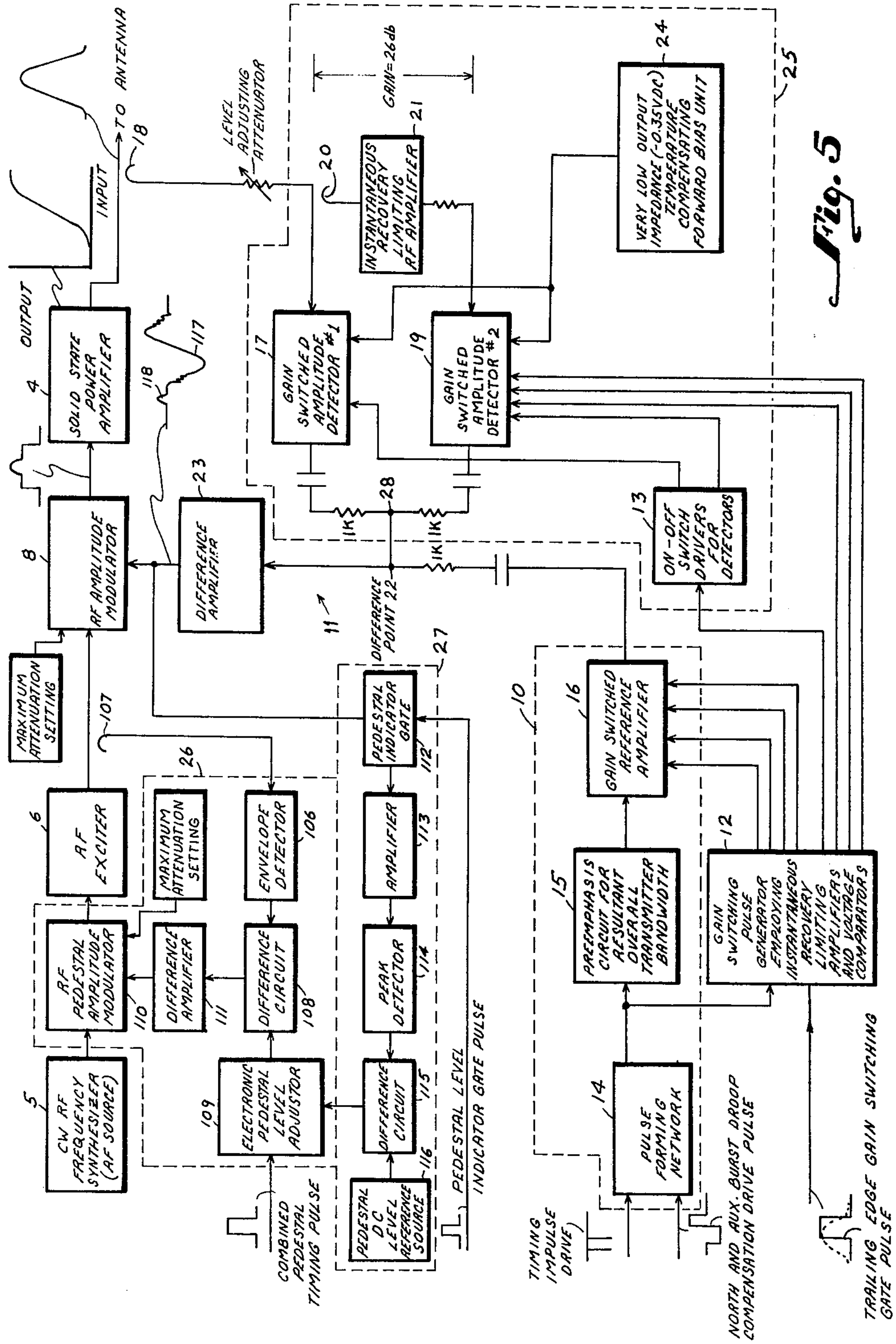
FIG. 5 is a block diagram of the feedback controlled modulation system in accordance with the principles of the present invention.

Referring to FIG. 5, there is illustrated therein a Vortac transmitter including power amplifier 4 having an input-output characteristic as illustrated in FIG. 3. It is the correct driving waveform for this amplifier 4 that is to be automatically produced by the feedback controlled modulation system of the present invention.

In addition to the Class C power amplifier 4, the transmitter also includes a frequency synthesizer 5 and an exciter 6, which provides a gated RF (radio frequency) carrier frequency to an amplitude modulator 8, whose output is coupled to amplifier 4. Also included in the usual transmitter is an amplifier 23, used to feed the modulating signal to modulator 8. Modulator 8 is shown as a shunt mode PIN diode modulator, but may be any other type of amplitude modulator.

In order to achieve the goal of feeding a correctly shaped modulating signal to modulator 8, which in turn will feed the correct RF driving waveform to the non-linear power amplifier 4, the system of the present invention further adds to the above functional blocks:

1. a gain controlled reference signal source 10;
2. an extended range, gain controlled detector system 25 in the fast acting primary feedback loop;
3. a gain controlling generator 12 in the form of a gain switching pulse generator which will produce gain switching waveforms which are a function of the modulating signal level which includes the capability of accomplishing separate trailing edge gain switching;
4. a second feedback loop 26, independent of the primary feedback loop, around exciter 6, whose function is to make the RF exciter output consist of controllable amplitude rectangular RF pulses having extremely flat tops, i.e. with less than approximately 1% variation in level over the used flat portion of this gated RF pulse. This flatness of exciter output is a practically important requirement because the constancy with which the overall system is correctly held at the threshold of the linearized Class C characteristic is strongly dependent upon the flatness of this gated exciter output; and
5. a third slow acting feedback loop 27 that obtains its feedback signal from a gated portion of the difference signal produced by the fast acting primary feedback loop and obtains its reference signal from a fixed DC (direct current) level. The difference signal output from this third feedback loop very accurately controls the amplitude of the very flat top pulses which must be supplied by the RF exciter 6 as described in 4 above, so as to hold the amplitude of the baseline output from modulator 8 exactly at the threshold of the linearized Class C characteristic of power amplifier 4.

The extended range detector system 25 includes a first gain switched amplitude detector 17 coupled to the output of amplifier 4 by a directional coupler 18, a second gain switched envelope detector 19 coupled to directional coupler 18 by a directional coupler 20 and an instantaneous recovery limiting RF amplifier 21, and a summing point 28 where the output of detectors 17 and 19 are added. The detector diodes employed in detectors 17 and 19 have a work function contact potential. To compensate for this contact potential, a forward bias unit 24 is provided which has a very low output impedance.

As illustrated in FIG. 3, a typical amplifier 4 will have a linear portion 2 of its input-output characteristic from −3 db down from its saturated output level to −26 db down from this saturated output level. However, due to the requirements placed upon the Vortac transmitter, particularly spectrum requirements, the overall transmitter must produce a modulated output shape which is correctly shaped down to a level which is typically −50 db to −60 db (or even lower) below the peak linear output. This −50 db to −60 db region is in the lower non-linear portion 3 of the input-output characteristic of FIG. 3. In accordance with the principles of the present invention, detector 17 is rendered operative during linear portion 2 and detector 19 is rendered inoperative during linear portion 2 by the output of switch drivers 13. When the −26 db level is reached, switch drivers 13, under control of generator 12, causes detector 17 to be rendered inoperative and detector 19 rendered operative. During non-linear portion 3 pulse generator 12 provides switching gates at different chosen levels, which may be, for example, the −32 db, −40 db and −46 db levels, which control the gain of detector 19 and simultaneously control the gain of reference amplifier 16 so as to linearize non-linear portion 3 of the input-output characteristic of FIG. 3 which results in providing simultaneously approximately constant loop gain and approximately a linear input-output characteristic for power amplifier 4 over a range starting from a chosen threshold level, which in this example is typically −50 db to −60 db below the linear peak output. This is accomplished without changing the stabilizing bandwidth, without loss of the given excess bandwidth and without causing amplitude distortion and, as a result, overcomes the disadvantages of the prior art automatic gain control feedback systems mentioned hereinabove.

Difference point 22 provides the input for difference amplifier 23 and is obtained by subtracting the output signal of detector 17 from the output signal from reference amplifier 16 when the feedback system is operating in the linear portion 2 of the characteristic of FIG. 3; with the output signal of detector 19 being subtracted from the output signal from reference amplifier 16 when the feedback system is operating in the non-linear portion 3 of the input-output characteristic of FIG. 3.

Feedback loop 26 includes an envelope detector 106 coupled to the output of RF exciter 6 via a directional coupler 107. The output of detector 106 is coupled to a difference circuit 108 whose other input is coupled to an electronic pedestal level adjuster 109. The combined pedestal time signal from FIG. 14 for the RF exciter unit is coupled to one input of adjuster 109 which may be a gated gain controlled D.C. amplifier. The output of difference circuit 108 is coupled to pedestal amplitude modulator 110 via difference amplifier 111. Modulator 110 is disposed between synthesizer 5 and exciter 6 so that the operation of feedback loop 26 enable obtaining the practically important requirement of achieving an extremely flat top controllable amplitude rectangular RF pulse at the output of exciter 6.

As mentioned above, feedback loop 27 is included to ensure that the amplitude of the very flat top pulses supplied by exciter 6 is such that the amplitude of baseline output from modulator 8 is at exactly the threshold of the linearized Class C characteristic of amplifier 4. To accomplish this, feedback loop 27 includes a pedestal indicator gate 112 having one input coupled to the output of difference amplifier 23 and a gate input receiving the pedestal level indicator gate pulse from FIG. 14, an amplifier 113 coupled to the output of gate 112, a peak detector 114 coupled to the output of amplifier 113 and a difference circuit 115 having one input coupled to the output of detector 114, a second input coupled to DC reference source 116 and a difference output coupled to an input of level adjuster 109. The waveform 117 at the output of amplifier 23 includes therein a pulse 118 whose amplitude varies proportional to the amplitude of the baseline output of modulator 8. Gate 112 is controlled by the indicator gate pulse to be conductive during the occurrence of pulse 118 and as a result passes pulse 118 whose amplitude after amplification is detected by detector 114. The difference output of circuit 115 is then used to control adjuster 109 so that the difference output of circuit 108 ensures that the amplitude of the baseline output of modulator 8 is at exactly the threshold of the linearized Class C characteristic of amplifier 4.

Figure 6:
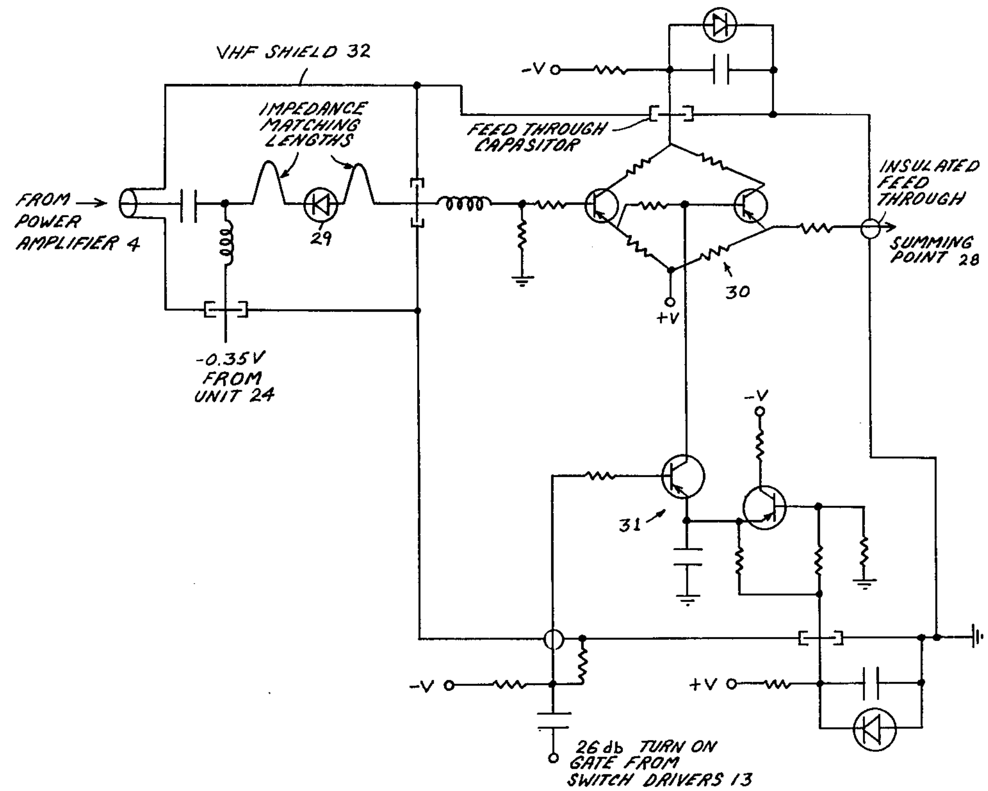
FIG. 6 is a schematic diagram of the gain switched amplitude detector 17 of FIG. 5.

Referring to FIG. 6, there is illustrated therein a schematic diagram of detector 17 of FIG. 5 which generally includes a diode detector 29 and a high input impedance-low output impedance stage 30 and a switching stage 31 which is under control of the output of switch drivers 13 to control when detector 17 is operative and when it is inoperative. It should be noted that the circuitry of FIG. 6 is contained within a VHF (very high frequency) shield 32, which is necessary in this circuit and other similar VHF circuits to prevent radiation from and pickup in these circuits due to the high frequency at which these circuits operate.

Figure 7:
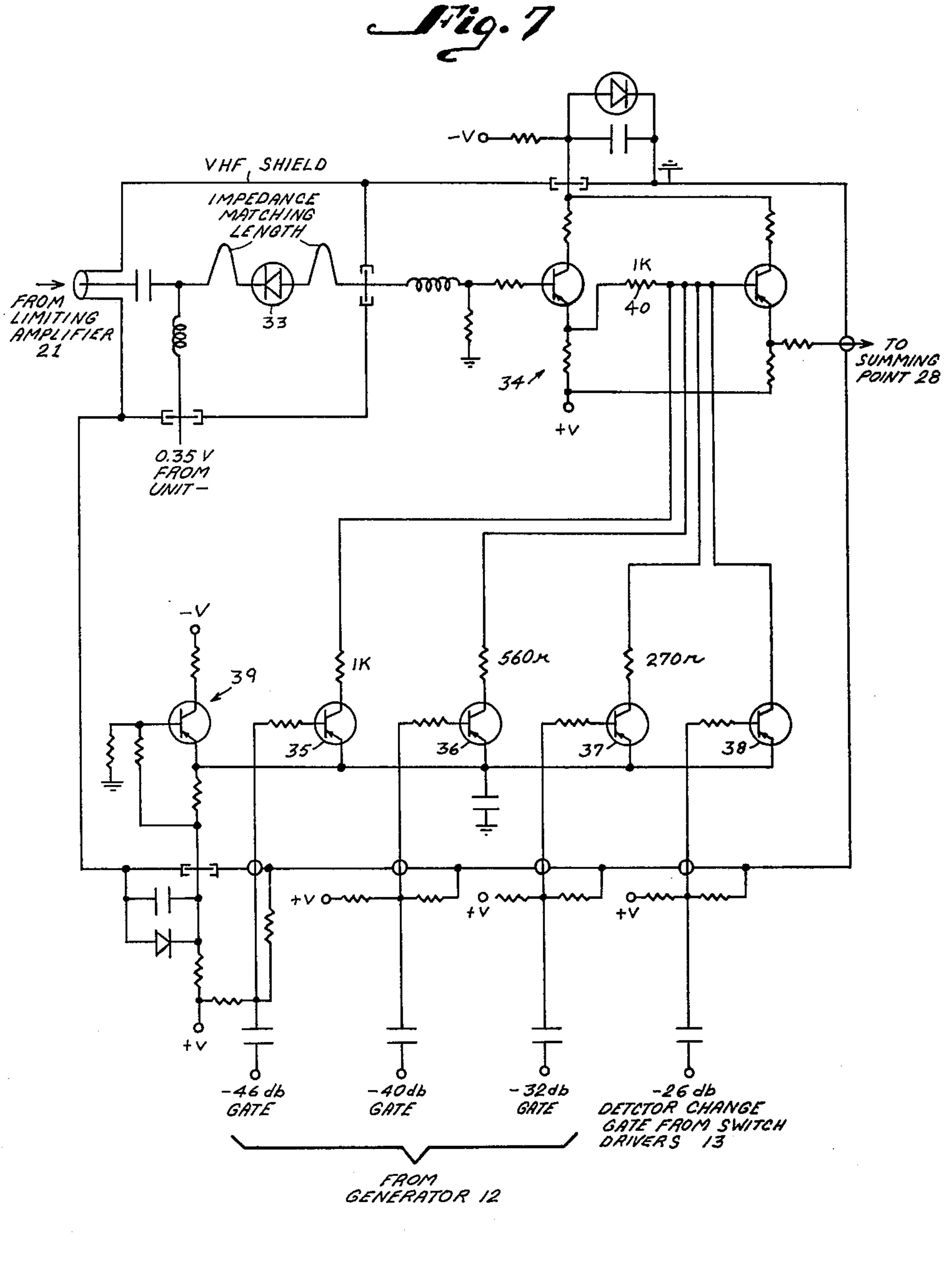
FIG. 7 is a schematic diagram of the gain switched amplitude detector 19 of FIG. 5.

Referring to FIG. 7, there is illustrated therein a schematic diagram of detector 19 of FIG. 5, which includes a diode detector 33, a high input impedance-low output impedance stage 34 driving a switched attenuator system whose gain is controlled by inserting different value resistors by means of switching transistors 35–37 which are controlled by gate pulses from generator 12 with the gate pulses being produced at different chosen levels, which in the present example occur at the −32 db and −46 db levels of the reference waveform. Switching transistor 38 under control of the gate output of switch drivers 13 determines when detector 19 is operative and when it is inoperative, with switch drivers 13 being triggered in this example by the −26 db level of the reference waveform which in this example is the change over level from linear position 2 to non-linear portion 3 of the characteristic of FIG. 3. Detector 19 is further provided with a DC generator 39 which produces a DC voltage for the emitter electrode of transistor switches 35–38 to compensate for the DC voltage present in resistor 40.

Figure 8:
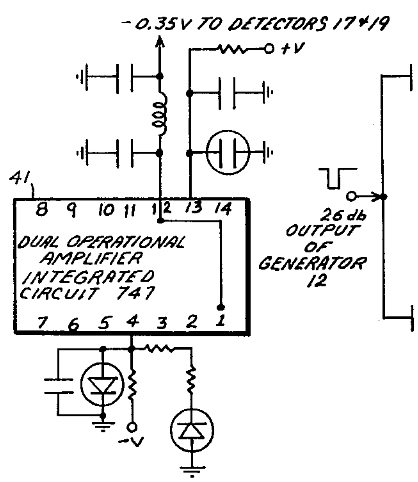
FIG. 8 is a schematic diagram, partially in block form, of the temperature compensating forward bias unit of FIG. 5.

Referring to FIG. 8, there is illustrated therein a schematic diagram, partially in block form, of unit 24 of FIG. 5 to provide the contact potential compensating forward bias for diode detectors 29 and 33 of FIGS. 6 and 7, respectively. Unit 24 uses a dual operational amplifier 41 which is in the form of integrated circuit 747 manufactured by many integrated circuit manufacturers, such as Fairchild, National Semiconductor and Motorola.

Figure 9:
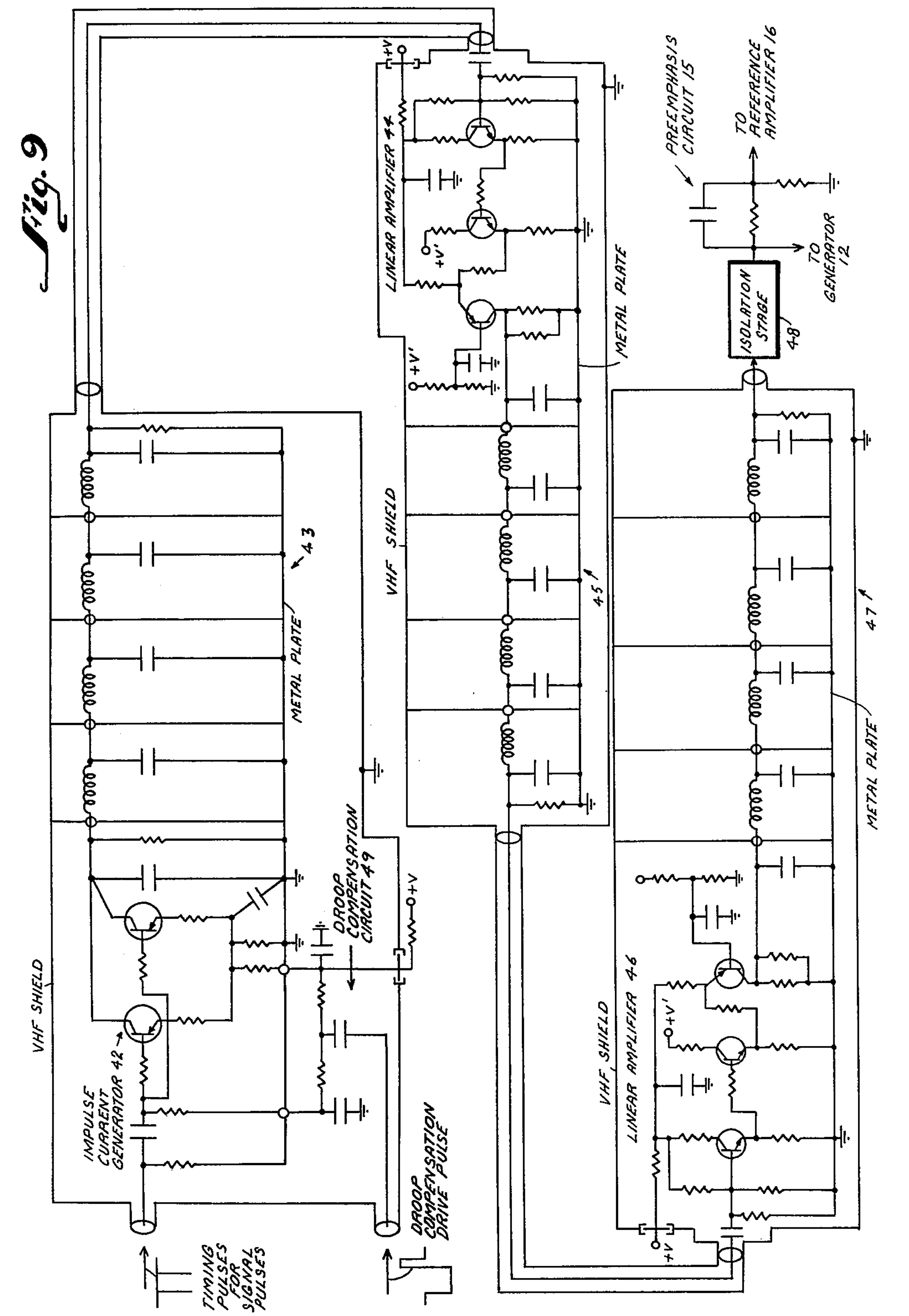
FIG. 9 is a schematic diagram of the reference pulse forming network and the pre-emphasis circuit of FIG. 5.

Referring to FIG. 9, there is illustrated therein a schematic diagram of pulse forming network 14 of FIG. 5 with element values chosen to supply a desired modulating shape which in this example is Gaussian. This unit is shielded by a VHF shield and includes an impulse current generator 42 which is driven by negative pulses, a first filter section 43, a first linear amplifier 44, a second filter section 45, a second linear amplifier 46, and a third filter section 47, all designed to provide the desired reference pulse waveform. The circuits of amplifiers 44 and 46 have been designed to provide extremely good low frequency response. This is necessary since when the gain of reference 16 is increased by 26 db, for example, it amplifies any "tilt" in the baseline of the pulse from network 14 which results due to poor low frequency response. This amplified baseline "tilt" would incorrectly move the pedestal level away from the threshold point of the linearized Class C characteristic. The output of filter section 47 feeds a high input impedance-low output impedance isolation stage 48 which is coupled to preemphasis circuit 15 shown schematically in FIG. 9 and to generator 12. The output from preemphasis circuit 15 is coupled to reference amplifier 16. Current generator 42 has a droop compensation circuit 49 coupled thereto to compensate for the Vortac group pulse droop at the output of amplifier 4. Circuit 49 raises the amplitude of the Vortac pulses adjacent the trailing edge of the group pulse input to compensate for the loss of amplitude in these pulses as they progress through the transmitter.

Figure 10:
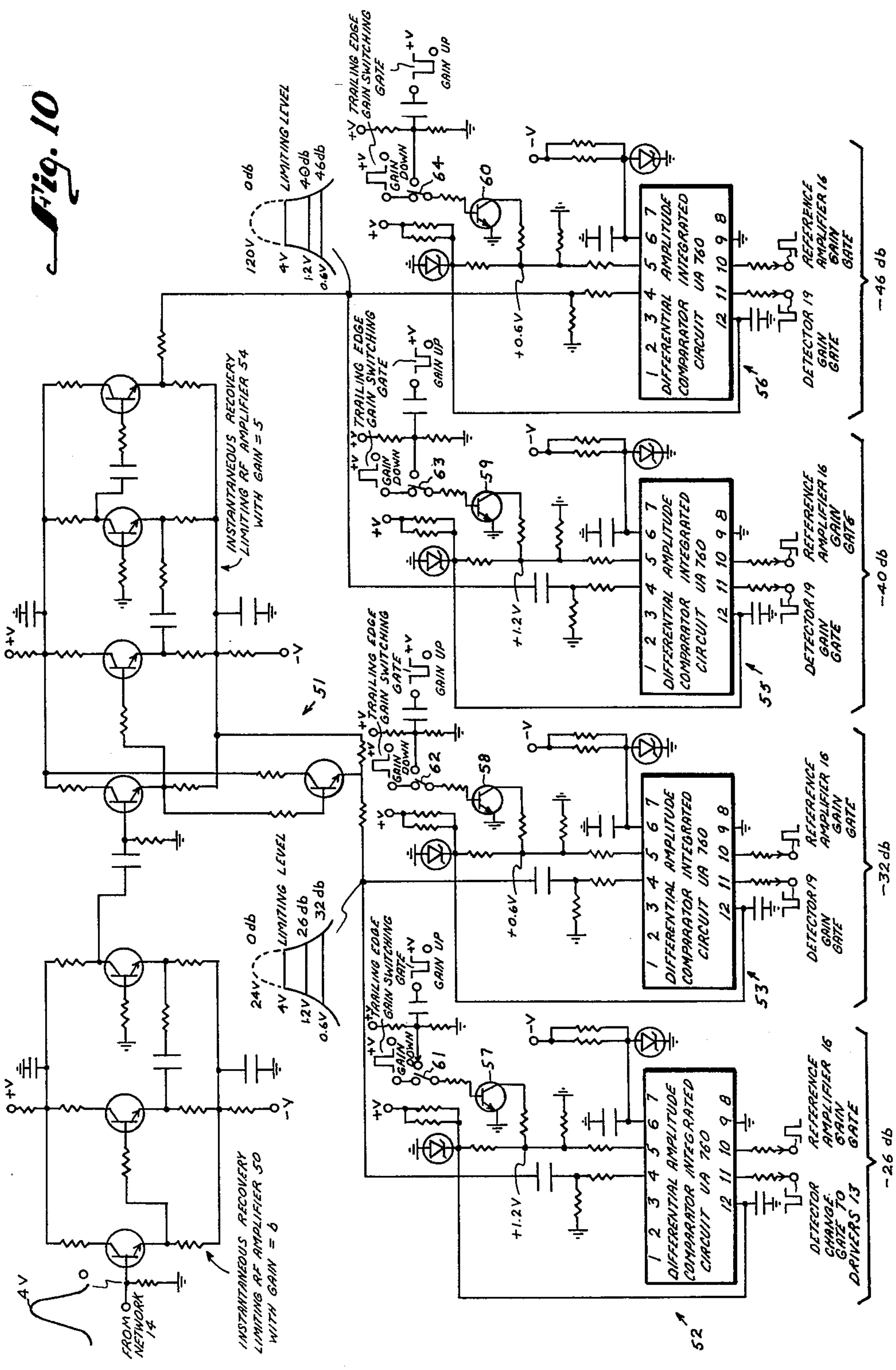
FIG. 10 is a schematic diagram of the gain switching pulse generator of FIG. 5 which converts the amplitude function of the modulating waveform to a pulse width function.

Referring to FIG. 10, there is illustrated therein schematically gain switching pulse generator 12 of FIG. 5 which includes an instantaneous recovery limiting amplifier 50 coupled to the output of isolation stage 48 of network 14 whose output is coupled to a low output impedance stage 51 whose output is employed as the input of comparator circuits 52 and 53. The output of amplifier stage 50 is also coupled to a second instantaneous recovery limiting amplifier stage 54 whose output is employed as the input of two additional amplitude comparator circuits 55 and 56. By employing instantaneous recovery amplifier stages 50 and 54 it is possible to provide the same comparison voltage for amplitude comparator circuits 52 and 55 and the same comparison voltage for amplitude comparator circuits 53 and 56 to derive the desired gain gates and the change over gate for drivers 13. Comparator circuits 52 and 55 have a comparison voltage equal to +1.2 volts with comparator circuit 52 providing the −26 db level gates and comparator circuit 55 providing the −40 db level gates. Comparator circuits 53 and 56 employ a 0.6 volt comparison voltage to provide the −32 db and −46 db level gates, respectively. The basic circuit of comparator circuits 52, 53, 55 and 56 is a differential amplitude comparator in the form of integrated circuit UA 760 available from the above-indicated integrated circuit manufacturers.

To enable gain matching of the trailing edge of the input pulse to generator 12 at different levels from that occurring on the leading edge of the input pulse, electronic switches, such as switching transistors 57–60, are coupled to comparator circuits 52, 53, 55 and 56 as shown in FIG. 10 to adjust the comparison voltage level up or down depending on the position of switches 61–64. The gate pulse for transistors 57–60 is generated in response to the peak of the input pulse to generator 12. This additional capability helps compensate for fast time varying changes in gain in amplifier 4, modulator 8, etc. due to the heating, etc.

Figure 11:
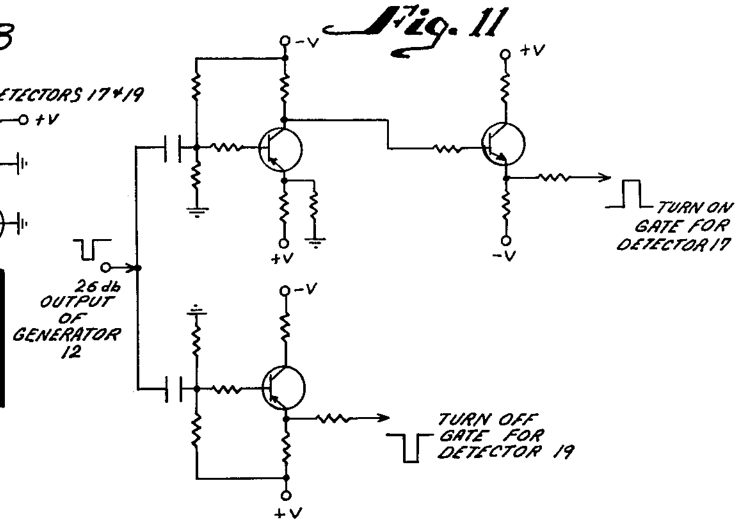
FIG. 11 is a schematic diagram of the on-off switch drivers of FIG. 5.

Referring to FIG. 11, there is illustrated therein a schematic diagram of switch drivers 13 of FIG. 5.

Figure 12:
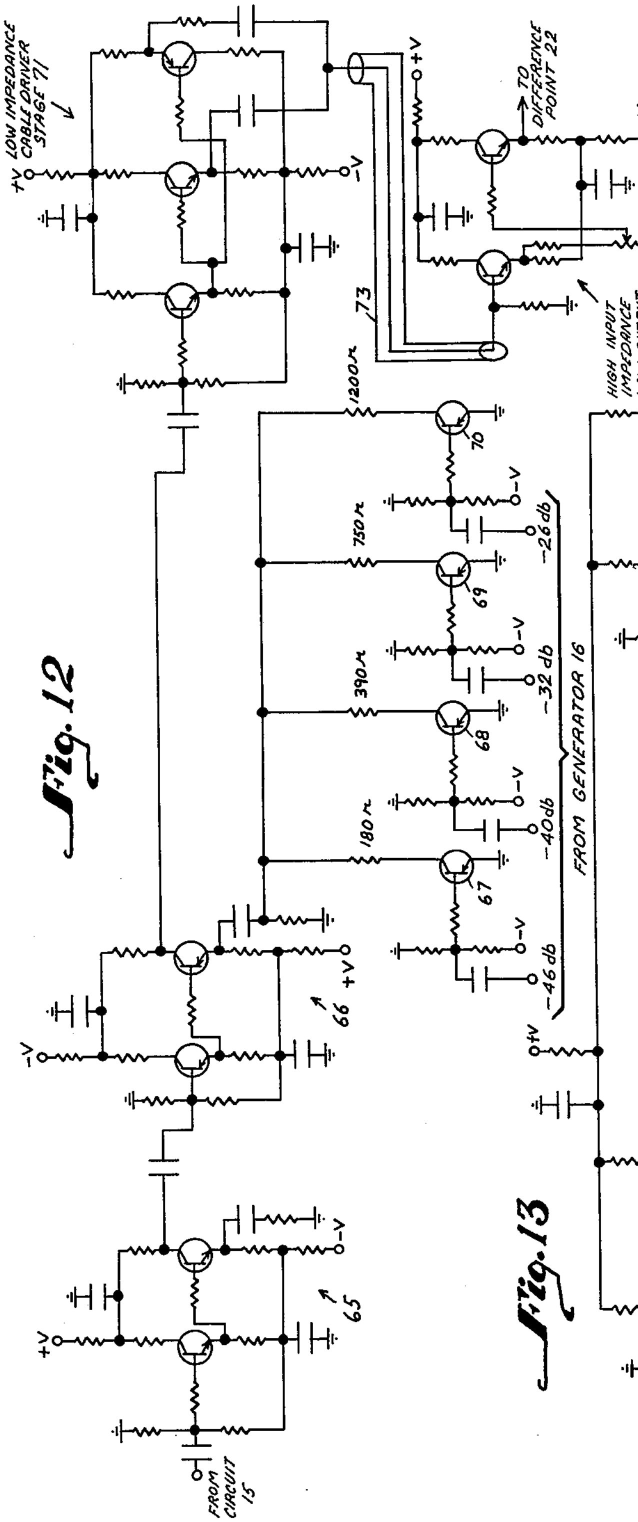
FIG. 12 is a schematic diagram of the gain switched reference amplifier of FIG. 5.

Referring to FIG. 12, there is illustrated therein a schematic diagram of gain switched reference amplifier 16 of FIG. 5. Reference amplifier 16 includes a first amplifier stage 65 and a gain controlled amplifier stage 66 which has switched into its circuit different values of resistances by switching transistors 67–70 under control of the gate pulses produced by generator 12 with the gain of reference amplifier 16 being adjusted simultaneously in step with the gain of detector 19. The output of gain controlled amplifier stage 66 is coupled to a low impedance cable driver stage 71 which is necessary in the reduction to practice of the present invention since the output stage 72 of reference amplifier 16 is physically spaced a relatively large distance from difference point 22. The output of stage 71 is coupled by a cable 73 to stage 72 which has a high input impedance and low output impedance. The output signal from stage 72 is coupled to difference point 22.

Figure 13:
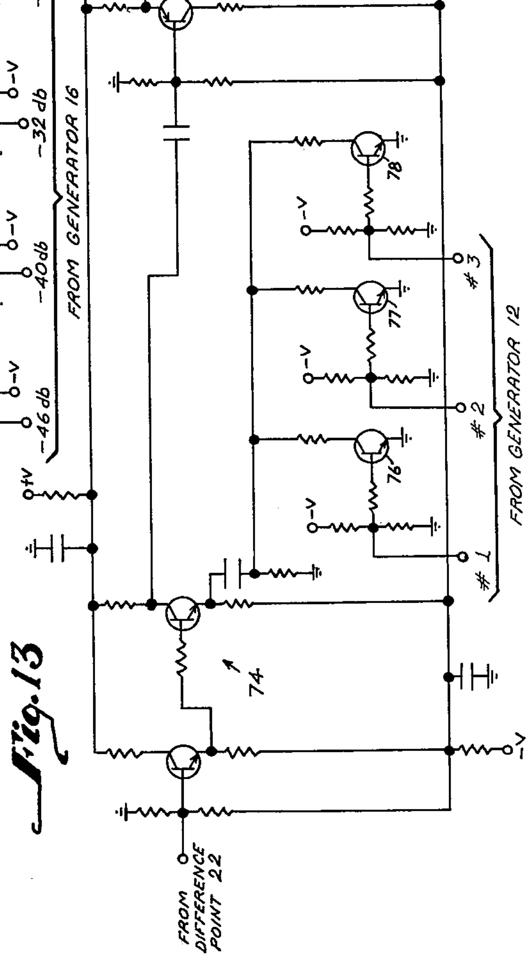
FIG. 13 is a schematic diagram of the gain switched difference amplifier of FIG. 5.

Referring to FIG. 13, there is illustrated therein a schematic diagram of gain switching difference amplifier 23 of FIG. 5 which includes an amplifier stage 74 and a low output impedance stage 75 to provide a negative pulse drive for modulator 8.

As illustrated in FIG. 13, amplifier stage 74 can be modified to be a gain controlled amplifier stage by incorporating different resistance values to be coupled into stage 74 by switching transistors 76–78 under control of gate pulses produced in generator 12 with these gate pulses being produced by similar comparator circuits to those disclosed in FIG. 10, but where the comparison voltages are selected to linearize the upper non-linear portion 1 of the input-output characteristic of FIG. 3.

Figure 14:
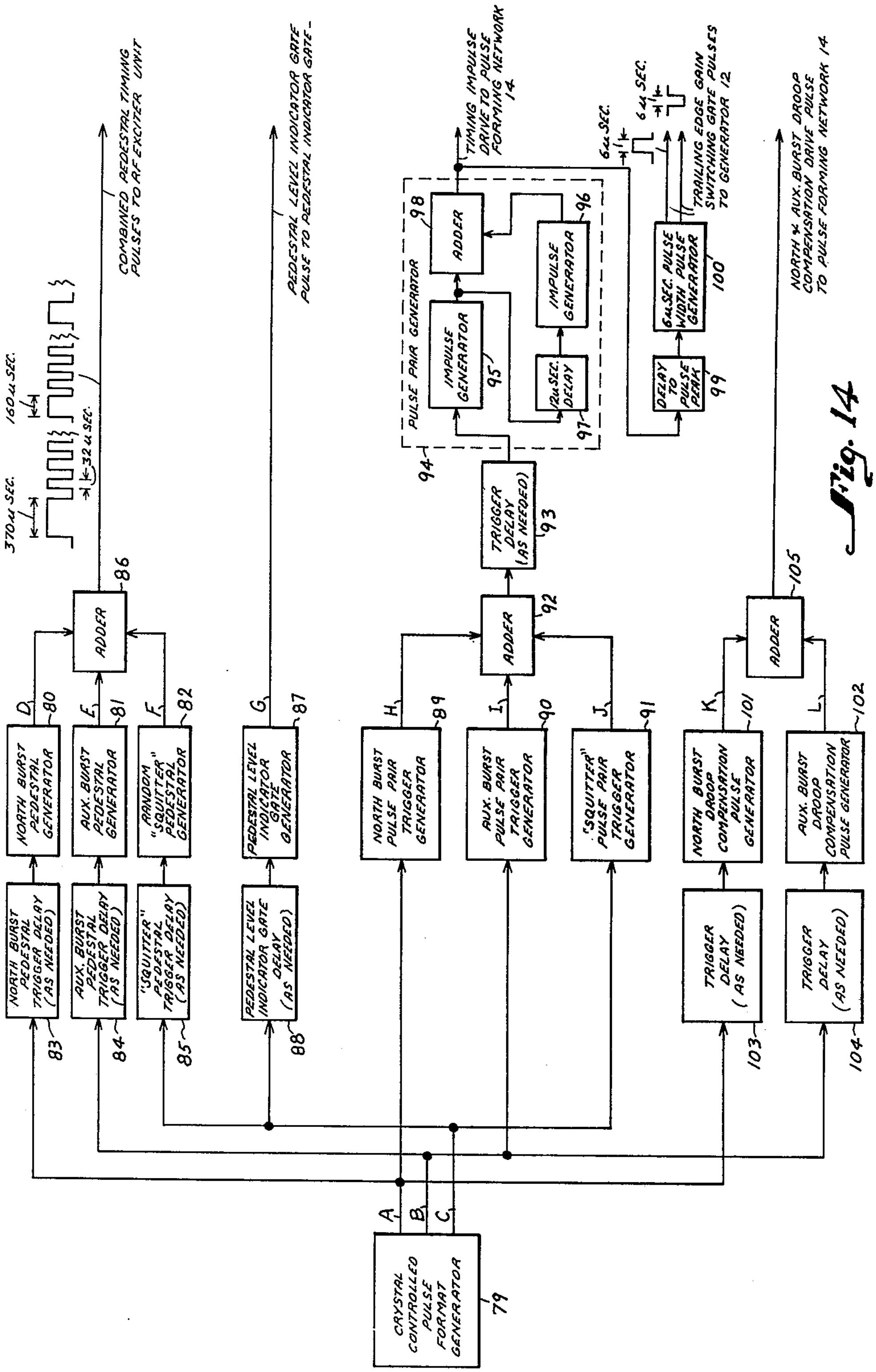
FIG. 14 is a block diagram of a timing pulse generator employed to control the timing of the operation of the feedback controlled modulation system of FIG. 5.
Figure 15:
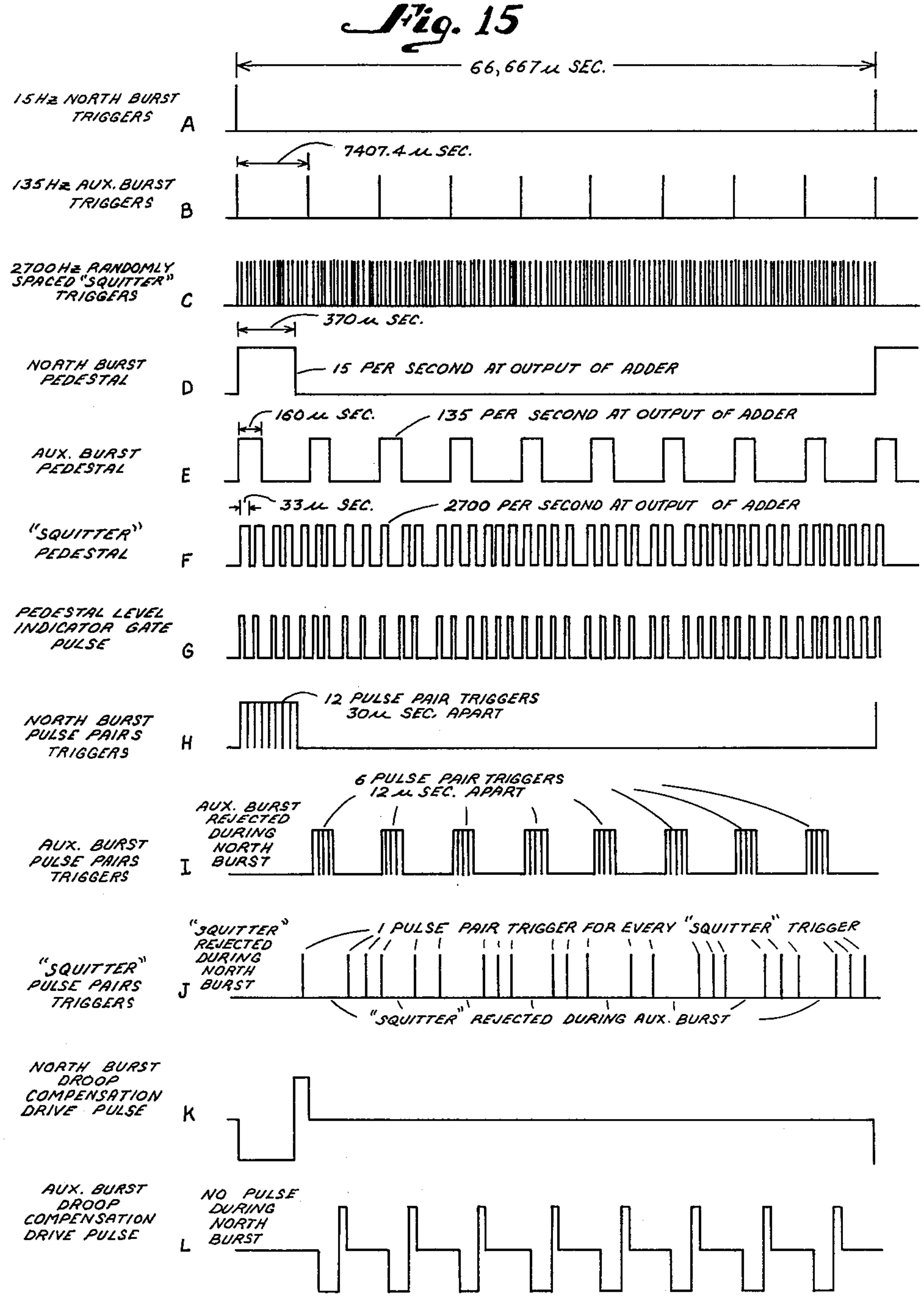
FIG. 15 is a timing diagram of the pulse waveforms of the generator of FIG. 14 where the letters identifying the waveforms therein are also employed to identify the location of the pulse waveform in the generator of FIG. 14.

Referring to FIG. 14, there is illustrated therein a block diagram of a time pulse generator to produce the various timing signals required to successfully operate the transmitter of the present invention as illustrated in block form in FIG. 5. FIG. 15 illustrates a timing diagram of the pulse waveforms generated in the generator of FIG. 14 with the location of the various waveforms of FIG. 15 being identified in FIG. 14 by the letter identification of the waveforms of FIG. 15.

The generator of FIG. 14 includes a crystal controlled pulse format generator 79 to produce the waveforms A, B and C of FIG. 15. The combined pedestal timing pulses for the RF exciter unit of FIG. 5 are produced by north burst pedestal generator 80, aux. burst generator 81 and "squitter" pedestal generator 82 each of which is coupled by a different one of trigger delay circuits 83–85 to generator 79. The waveform outputs D, E and F of FIG. 15 are combined in adder 86 to provide the desired combined pedestal timing pulses. Generators 80–82 are monostable circuits with appropriately selected RC time constants to produce the waveforms D, E and F of FIG. 15. The delay circuits 83–85 are also monostable circuits with appropriately selected RC time constants.

The pedestal level indicator gate pulse is produced by generator 87, in the form of a monostable circuit with an appropriately selected RC time constant, coupled to generator 79 responsive to waveform C of FIG. 15 by means of a delay circuit 88, in the form of a monostable circuit with an appropriately selected RC time constant.

The timing impulse drive to network 14 is generated by north burst pulse pair trigger generator 89 responsive to waveform A of FIG. 15 from generator 79, aux. burst pulse pair trigger generator 90 responsive to waveform B of FIG. 15 from generator 79, "squitter" pulse pair trigger generator 91 responsive to waveform C of FIG. 15 from generator 79, adder 92 to combine the waveforms H, I and J of FIG. 15 from generators 89–91, respectively, trigger delay circuit 93 coupled to the output of adder 92 and pulse pair generator 94 coupled to the output of delay circuit 93. Generators 89–91 are synchronous burst generators employing appropriately selected monostable circuits, delay circuit 93 is a monostable circuit with an appropriately selected RC time constant and generator 94 includes impulse generators 95 and 96, in the form of monostable circuits with appropriately selected RC time constants, a delay circuit 97, in the form of an appropriately selected monostable circuit, and an adder 98 connected as illustrated.

The trailing edge gain switching gate pulses are generated by a delay circuit 99 coupled to the output of generator 94 which produces an output indicating when the peak of the pulse input to generator 12 is present. The output of circuit 99 is coupled to pulse generator 100 to produce the desired width gate pulses. Circuit 99 and generator 100 are again monostable circuits with appropriately selected RC time constants.

The north burst and aux. burst droop compensation drive pulses are generated by pulse generators 101 and 102 coupled to generator 79 by means of trigger delay circuits 103 and 104, respectively, to be responsive to waveforms A and B of FIG. 15, respectively. Generators 101 and 102 are each in the form of two monostable circuits with appropriately selected RC time constants whose outputs are combined in an adder to provide waveforms K and L of FIG. 15. These waveforms are combined in adder 105 to provide the required droop compensation drive pulses.

While I have described above the principles of my invention in connection with specific apparatus, it is to be clearly understood that this description is made only by way of example and not as a limitation to the scope of my invention as set forth in the objects thereof and in the accompanying claims.

I claim:

1. A multistate feedback controlled modulation system for linearizing and stabilizing an amplifier having an input-output characteristic including a linear portion and at least a lower non-linear portion comprising:

an extended range, gain controlled detector system disposed in a first feedback loop coupled to the output and input of said amplifier;

a gain controlled reference signal source coupled to an output of said detector system to provide a difference signal in said first feedback loop;

a gain controlling pulse generator coupled to said source and said detector system to simultaneously control the gain of said source and the gain of said detector system to control the shape of said difference signal so as to linearize said lower non-linear portion of said characteristic without loss of loop stability and without causing amplitude distortion in said first feedback loop;

an exciter to provide controllable amplitude, rectangular pulses;

a first amplitude modulator disposed in said first feedback loop coupled to the input of said amplifier and the output of said exciter responsive to an amplified version of said difference signal and said rectangular pulses;

a second feedback loop coupled between an output and an input of said exciter to provide an extremely flat top for each of said rectangular pulses; and a third feedback loop coupled to said first and second feedback loops responsive to a predetermined gated portion of said amplified version of said difference signal to produce a control signal for said second feedback loop to accurately control the amplitude of said flat top rectangular pulses so as to hold the amplitude of a baseline portion of the output signal of said modular exactly at the threshold of said linearized characteristic.

2. A system according to claim 1, wherein said first feedback loop is a fast acting feedback loop.

3. A system according to claim 2, wherein said third feedback loop is a very slow acting feedback loop.

4. A system according to claim 1, wherein said amplifier is a Class C power amplifier.

5. A system according to claim 1, wherein said source includes a pulse forming network driven by pulses to provide said reference signal having a predetermined shape, a preemphasis circuit coupled to the output of said pulse forming network, and a gain controlled reference amplifier coupled to the output of said preemphasis circuit, and the output of said control pulse generator.

6. A system according to claim 5, wherein said pulse forming network includes a pulse current generator driven by said pulses, a droop compensating circuit coupled to said current generator responsive to a compensating pulse, a first filter network coupled to the output of said current generator, a first linear amplifier coupled to the output of said first filter network, a second filter network coupled to the output of said first linear amplifier, a second linear amplifier coupled to the output of said second filter network, and a third filter network coupled to the output of said second linear amplifier.

7. A system according to claim 6, wherein said reference amplifier includes at least one amplifier stage having its gain changed by said control pulse generator at a given number of said different amplitude levels of said reference signal.

8. A system according to claim 7, wherein said given amplitude levels are minus 26 db, 32 db, 40 db and 46 db from the peak of said reference signal.

9. A system according to claim 7, wherein said detector system includes at least two gain controlled amplitude detectors.

10. A system according to claim 7, whrein one of said two detectors is controlled by said controlling pulse generator to be operative during said linear portion of said characteristic and the other of said two detectors is controlled by said controlling pulse generator to be inoperative during said linear portion of said characteristic.

11. A system according to claim 10, wherein said one of said two detectors is controlled by said controlling pulse generator to be inoperative during said lower non-linear portion of said characteristic and said other of said two detectors is controlled by said controlling pulse generator to be operative during said lower non-linear portion of said characteristic and to have its gain changed at given number of different amplitude levels.

12. A system according to claim 11, wherein said given amplitude levels are minus 26 db, 32 db, 40 db and 46 db from the peak of said reference signal.

13. A system according to claim 11, wherein said linear portion of said characteristic ends at and said lower non-linear portion of said characteristic starts at a predetermined level down from the peak of said reference signal, said one of said two detectors being switched to its inoperative state and said other of said two detectors being switched to its operative state at said predetermined level.

14. A system according to claim 11, wherein said controlling pulse generator includes a plurality of amplitude comparators equal in number to said given amplitude levels to produce a corresponding number of first gate pulses to control said reference amplifier and a corresponding number of second gate pulses to control said two detectors.

15. A system according to claim 14, wherein said plurality of comparators number four, and each of said four comparators produce a different one of said first and second gate pulses.

16. A system according to claim 15, wherein a first of said four comparators produces a first of said first and second gate pulses at a first predetermined level down from the peak of said reference signal, a second of said four comparators produces a second of said first and second gate pulses at a second predetermined level down from the peak of said reference signal which is lower than said first level, a third of said four comparators produces a third of said first and second gate pulses at a third predetermined level down from the peak of said reference signal which is lower than said second level and a fourth of said four comparators produces a fourth of said first and second gate pulses at a fourth predetermined level down from the peak of said reference signal which is lower than said third level.

17. A system according to claim 16, further including a trailing edge gain switch coupled to each of said four comparators rendered operative at the peak of input pulses driving said controlling generator to provide a value for said first, second, third and fourth levels for the trailing edge of said input pulses which is different than the values for said first, second, third and fourth levels for the leading edge of said input pulses.

18. A system according to claim 14, further including a trailing edge gain switch coupled to each of said plurality of comparators rendered operative at the peak of input pulses driving said controlling generator to provide a value for each of said given amplitude levels for the trailing edge of said input pulses which is different than the values for each of said given amplitude levels for the leading edge of said input pulses.

19. A system according to claim 14, wherein said controlling pulse generator further includes a first instantaneous recovery limiting amplifier coupled between said pulse forming network and certain ones of said plurality of comparators, and a second instantaneous recovery limiting amplifier coupled between said first amplifier and the others of said plurality of comparators.

20. A system according to claim 19, wherein said plurality of comparators number four with two of said four comparators being coupled to said first amplifier and the remaining two of said four comparators being coupled to said second amplifier.

21. A system according to claim 20, wherein one of said two of said four comparators and one of said remaining two of said four comparators has a first comparison potential applied thereto to produce a first of said first and second gate pulses at the output of said one of said two of said four comparators at a first predetermined level down from the peak of said reference signal and a second of said first and second gate pulses at the output of said one of said remaining two of said four comparators at a second predetermined level down from the peak of said reference signal which is less than said first level, and the other of said two of said four comparators and the other of said remaining two of said four comparators has a second comparison potential different than said first comparison potential applied thereto to produce a third of said first and second gate pulses at the output of said other of said two of said four comparators at a third predetermined level down from the peak of said reference signal which is different than and between said first and second levels and a fourth of said first and second gate pulses at the output of said other of said remaining two of said four comparators at a fourth predetermined level down from the peak of said reference signal which is less than said second level.

22. A system according to claim 21, further including a trailing edge gain switch coupled to each of said four comparators rendered operative at the peak of input pulses driving said controlling generator to provide a value for said first and second comparison potentials for the trailing edge of said input pulses which is different than the values for said first and second comparison potentials for the leading edge of said input pulses.

23. A system according to claim 14, wherein said one of said two detectors is coupled to the output of said amplifier by a first directional coupler coupled to the output of said amplifier, and said other of said two detectors is coupled to the output of said amplifier by said first directional coupler, a second directional coupler coupled to said first directional coupler and an instantaneous recovery limiting RF amplifier coupled between said second directional coupler and the input of said other of said two detectors.

24. A system according to claim 23, wherein said characteristic includes an upper non-linear portion, and said first feedback loop includes at least one amplifier stage coupled to said controlling pulse generator for control of the gain thereof to linearize said upper non-linear portion of said characteristic.

25. A system according to claim 1, wherein said source includes at least one amplifier stage having its gain changed by said controlling pulse generator at a given number of different amplitude levels of said reference signal.

26. A system according to claim 25, wherein said given amplitude levels are minus 26 db, 32 db, 40 db and 46 db from the peak of said reference signal.

27. A system according to claim 25, wherein said detector system includes at least two gain controlled amplitude detectors.

28. A system according to claim 27, wherein one of said two detectors is controlled by said controlling pulse generator to be operative during said linear portion of said characteristic and the other of said two detectors is controlled by said controlling pulse generator to be inoperative during said linear portion of said characteristic.

29. A system according to claim 28, wherein said one of said two detectors is controlled by said controlling pulse generator to be inoperative during said lower non-linear portion of said characteristic and said other of said two detectors is controlled by said controlling pulse generator to be operative during said lower non-linear portion of said characteristic and to have its gain changed at said given number of different amplitude levels.

30. A system according to claim 29, wherein said given amplitude levels are minus 26 db, 32 db, 40 db and 46 db from the peak of said reference signal.

31. A system according to claim 30, wherein said linear portion of said characteristic ends at and said lower non-linear portion of said characteristic starts at a predetermined level down from the peak of said reference signal, said one of said two detectors being switched to its inoperative state and said other of said two detectors being switched to its operative state at said predetermined level.

32. A system according to claim 29, wherein said controlling pulse generator includes a plurality of amplitude comparators equal in number to said given amplitude levels to produce a corresponding number of first gate pulses to control said source and a corresponding number of second gate pulses to control said two detectors.

33. A system according to claim 32, wherein said plurality of comparators number four, and each of said four comparators produce a different one of said first and second gate pulses.

34. A system according to claim 33, wherein a first of said four comparators produces first of said first and second gate pulses at a first predetermined level from the peak of said reference signal, a second of said four comparators produces a second of said first and second gate pulses at a second predetermined level down from the peak of said reference signal which is lower than said first level, a third of said four comparators produces a third of said first and second gate pulses at a third predetermined level down from the peak of said reference signal which is less than said second level and a fourth of said four comparators produces a fourth of said first and second gate pulses at a fourth predetermined level down from the peak of said reference signal which is less than said third level.

35. A system according to claim 34, further including a trailing edge gain switch coupled to each of said four comparators rendered operative at the peak of input pulses driving said controlling generator to provide a value for said first, second, third and fourth levels for the trailing edge of said input pulses which is different than the values for said first, second, third and fourth levels for the leading edge of said input pulses.

36. A system according to claim 32, further including a trailing edge gain switch coupled to each of said plurality of comparators rendered operative at the peak of input pulses driving said controlling generator to provide a value for each of said given amplitude levels for the trailing edge of said input pulses which is different than the values for each of said given amplitude levels for the leading edge of said input pulses.

37. A system according to claim 32, wherein said controlling pulse generator further includes a first instantaneous recovery limiting amplifier coupled between said source and certain ones of said plurality of comparators, and a second instantaneous recovery limiting amplifier coupled between said first amplifier and the others of said plurality of comparators.

38. A system according to claim 37, wherein said plurality of comparators number four with two of said four comparators being coupled to said first amplifier and the remaining two of said four comparators being coupled to said second amplifier.

39. A system according to claim 38, wherein one of said two of said four comparators and one of said remaining two of said four comparators has a first comparison potential applied thereto to produce a first of said first and second gate pulses at the output of said one of said two of said four comparators at a first predetermined level down from the peak of said reference signal and a second of said first and second gate pulses at the output of said one of said remaining two of said four comparators at a second predetermined level down from the peak of said reference signal which is less than said first level, and the other of said two of said four comparators and the other of said remaining two of said four comparators has a second comparison potential different than said first comparison potential applied thereto to produce a third of said first and second gate pulses at the output of said other of said two of said four comparators at a third predetermined level down from the peak of said reference signal which is different than and between said first and second levels and a fourth of said first and second gate pulses at the output of said other of said remaining two of said four comparators at a fourth predetermined level down from the peak of said reference signal which is less than said second level.

40. A system according to claim 39, further including a trailing edge gain switch coupled to each of said four comparators rendered operative at the peak of input pulses driving said controlling generator to provide a value for said first and second comparison potentials for the trailing edge of said input pulses which is different than the values for said first and second comparison potentials for the leading edge of said input pulses.

41. A system according to claim 32, wherein said one of said two detectors is coupled to the output of said amplifier by a first directional coupler coupled to the output of said amplifier, and said other of said two detectors is coupled to the output of said amplifier by said first directional coupler, a second directional coupler coupled to said first directional coupler and an instantaneous recovery limiting RF amplifier coupled between said second directional coupler and the input of said other of said two detectors.

42. A system according to claim 41, wherein said characteristic includes an upper non-linear portion, and said first feedback loop includes at least one amplifier stage coupled to said controlling pulse generator for control of the gain thereof to linearize said upper non-linear portion of said characteristic.

43. A system according to claim 1, wherein said detector system includes at least two gain controlled amplitude detectors.

44. A system according to claim 43, wherein one of said two detectors is controlled by said controlling pulse generator to be operative during said linear portion of said characteristic and the other of said two detectors is controlled by said controlling pulse generator to be inoperative during said linear portion of said characteristic.

45. A system according to claim 44, wherein said one of said two detectors is controlled by said controlling pulse generator to be inoperative during said lower non-linear portion of said characteristic and said other of said two detectors is controlled by said controlling pulse generator to be operative during said lower non-linear portion of said characteristic and to have its gain changed at a given number of different amplitude levels.

46. A system according to claim 45, wherein said linear portion of said characteristic ends at and said lower non-linear portion of said characteristic starts at a predetermined level down from the peak of said reference signal, said one of said two detectors being switched to its inoperative state and said other of said two detectors being switched to its operative state at said predetermined level.

47. A system according to claim 45, wherein said controlling pulse generator includes a plurality of amplitude comparators equal in number to said given amplitude levels to produce a corresponding number of first gate pulses to control said reference amplifier and a corresponding number of second gate pulses to control said two detectors.

48. A system according to claim 47, wherein said plurality of comparators number four, and each of said four comparators produce a different one of said first and second gate pulses.

49. A system according to claim 48, wherein a first of said four comparators produces a first of said first and second gate pulses at a first predetermined level down from the peak of said reference signal, a second of said four comparators produces a second of said first and second gate pulses at a second predetermined level down from the peak of said reference signal which is lower than said first level, a third of said four comparators produces a third of said first and second gate pulses at a third predetermined level down from the peak of said reference signal which is less than said second level and a fourth of said four comparators produces a fourth of said first and second gate pulses at a fourth predetermined level down from the peak of said reference signal which is less than said third level.

50. A system according to claim 47, wherein said controlling pulse generator further includes a first instantaneous recovery limiting amplifier coupled between said source and certain ones of said plurality of comparators, and a second instantaneous recovery limiting amplifier coupled between said first amplifier and the others of said plurality of comparators.

51. A system according to claim 50, wherein said plurality of comparators number four with two of said four comparators being coupled to said first amplifier and the remaining two of said four comparators being coupled to said second amplifier.

52. A system according to claim 51, wherein one of said two of said four comparators and one of said remaining two of said four comparators has a first comparison potential applied thereto to produce a first of said first and second gate pulses at the output of said one of said two of said four comparators at a first predetermined level down from the peak of said reference signal and a second of said first and second gate pulses at the output of said one of said remaining two of said four comparators at a second predetermined level down from the peak of said reference signal which is less than said first level, and the other of said two of said four comparators and the other of said remaining two of said four comparators has a second comparison potential different than said first comparison potential applied thereto to produce a third of said first and second gate pulses at the output of said other of said two of said four comparators at a third predetermined level down from the peak of said reference signal which is different than and between said first and second levels and a fourth of said first and second gate pulses at the output of said other of said remaining two of said four comparators at a fourth predetermined level down from the peak of said reference signal which is less than said second level.

53. A system according to claim 52, further including a trailing edge gain switch coupled to each of said four comparators rendered operative at the peak of input pulses driving said controlling generator to provide a value for said first and second comparison potentials for the trailing edge of said input pulses which is different than the values for said first and second comparison potentials for the leading edge of said input pulses.

54. A system according to claim 47, wherein said one of said two detectors is coupled to the output of said amplifier by a first directional coupler coupled to the output of said amplifier, and said other of said two detectors is coupled to the output of said amplifier by said first directional coupler, a second directional coupler coupled to said first directional coupler and an instantaneous recovery limiting RF amplifier coupled between said second directional coupler and the input of said other of said two detectors.

55. A system according to claim 1, wherein said controlling pulse generator includes a plurality of amplitude comparators equal in number to a given number of different amplitude levels to produce a corresponding number of first gate pulses to control said source and a corresponding number of second gate pulses to control said detector system.

56. A system according to claim 55, wherein said plurality of comparators number four, and each of said four comparators produce a different one of said first and second gate pulses.

57. A system according to claim 56, wherein a first of said four comparators produces a first of said first and second gate pulses at a first predetermined level down from the peak of said reference signal, a second of said four comparators produces a second of said first and second gate pulses at a second predetermined level down from the peak of said reference signal which is less than said first level, a third of said four comparators produces a third of said first and second gate pulses at a third predetermined level down from the peak of said reference signal which is less than said second level and a fourth of said four comparators produces a fourth of said first and second gate pulses at a fourth predetermined level down from the peak of said reference signal which is less than said third level.

58. A system according to claim 55, wherein said controlling pulse generator further includes a first instantaneous recovery limiting amplifier coupled between said source and certain ones of said plurality of comparators, and a second instantaneous recovery amplifier coupled between said first amplifier and the others of said plurality of comparators.

59. A system according to claim 58, wherein said plurality of comparators number four with two of said four comparators being coupled to said first amplifier and the remaining two of said four comparators being coupled to said second amplifier.

60. A system according to claim 59, wherein one of said two of said four comparators and one of said remaining two of said four comparators has a first comparison potential applied thereto to produce a first of said first and second gate pulses at the output of said one of said two of said four comparators at a first predetermined level down from the peak of said reference signal and a second of said first and second gate pulses at the output of said one of said remaining two of said four comparators at a second predetermined level down from the peak of said reference signal which is less than said first level, and the other of said two of said four comparators and the other of said remaining two of said four comparators has a second comparison potential different than said first comparison potential applied thereto to produce a third of said first and second gate pulses at the output of said other of said two of said four comparators at a third predetermined level down from the peak of said reference signal which is different than and between said first and second levels and a fourth of said first and second gate pulses at the output of said other of said remaining two of said four comparators at a fourth predetermined level down from the peak of said reference signal which is less than said second level.

61. A system according to claim 60, further including a trailing edge gain switch coupled to each of said four comparators rendered operative at the peak of input pulses driving said controlling generator to provide a value for said first and second comparason potentials for the trailing edge of said input pulses which is different than the values for said first and second comparison potentials for the leading edge of said input pulses.

62. A system according to claim 1, wherein said second feedback loop includes a directional coupler coupled to the output of said exciter, an envelope detector coupled to said coupler, a first difference circuit having an output, one input coupled to said envelope detector and another input coupled to an electronic pedestal level adjustor receiving timing pulses on one input thereof, a difference amplifier coupled to said output of said difference circuit, and a second amplitude modulator having one input coupled to said difference amplifier, another input coupled to a carrier signal source and an output coupled to the input of said exciter.

63. A system according to claim 62, wherein said third feedback loop includes gate having an input coupled to said first feedback loop at an input of said first modulator disposed therein rendered operative to pass only said predetermined gated portion, an amplifier coupled to an output of said gate, a peak detector coupled to an output of said amplifier, and a second difference circuit having one input coupled to the output of said peak detector, another input coupled to a DC level reference source and an output for said control signal coupled to said level adjustor.

64. A system according to claim 1, wherein said third feedback loop includes a gate having an input coupled to said first feedback loop at an input of said first modulator disposed therein rendered operative to pass only said predetermined gated portion, an amplifier coupled to an output of said gate, a peak detector coupled to an output of said amplifier, and a difference circuit having one input coupled to the output of said peak detector, another input coupled to a DC level reference source and an output for said control signal coupled to said second feedback loop.

* * * * *